United States Patent
Shinoda et al.

(10) Patent No.: US 10,190,875 B2
(45) Date of Patent: Jan. 29, 2019

(54) PATTERN MEASUREMENT CONDITION SETTING DEVICE AND PATTERN MEASURING DEVICE

(71) Applicant: HITACHI HIGH-TECHNOLOGIES CORPORATION, Minato-ku, Tokyo (JP)

(72) Inventors: Shinichi Shinoda, Tokyo (JP); Yasutaka Toyoda, Tokyo (JP); Hiroyuki Ushiba, Tokyo (JP); Hitoshi Sugahara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/321,667

(22) PCT Filed: Jun. 17, 2015

(86) PCT No.: PCT/JP2015/067385
§ 371 (c)(1),
(2) Date: Dec. 22, 2016

(87) PCT Pub. No.: WO2015/198926
PCT Pub. Date: Dec. 30, 2015

(65) Prior Publication Data
US 2017/0160082 A1 Jun. 8, 2017

(30) Foreign Application Priority Data
Jun. 27, 2014 (JP) .................................. 2014-132016

(51) Int. Cl.
*G01B 15/04* (2006.01)
*H01L 21/027* (2006.01)
(Continued)

(52) U.S. Cl.
CPC ......... *G01B 15/04* (2013.01); *G03F 7/70625* (2013.01); *G03F 7/70641* (2013.01);
(Continued)

(58) Field of Classification Search
CPC .. H01J 37/00; H01J 37/02; H01J 37/26; H01J 37/28; H01J 37/304; G01B 15/00; G01B 15/04
(Continued)

(56) References Cited

U.S. PATENT DOCUMENTS 8,547,429 B2    10/2013  Honda et al.
2002/0005496 A1  1/2002  Sakamoto et al.
(Continued)

FOREIGN PATENT DOCUMENTS

JP    2002-093697 A    3/2002
JP    2005-189137 A    7/2005
(Continued)

*Primary Examiner* — Jason McCormack
(74) *Attorney, Agent, or Firm* — Miles & Stockbridge P.C.

(57) ABSTRACT

The purpose of the present invention is to provide a pattern measurement condition setting device which appropriately sets a measurement condition for finding out an appropriate exposure condition. To achieve the purpose, proposed is a pattern measurement condition setting device which sets a pattern measurement condition when the measurement of a pattern is executed, and is provided with an arithmetic unit which selects a pattern having a predetermined condition from pattern information for each exposure condition obtained when the exposure condition of a reduced projection exposure device is changed or pattern information for each exposure condition obtained when the exposure condition is changed by optical simulation, the arithmetic unit selecting a pattern as an object to be measured or a candidate for the object to be measured, the change of the size or shape of the pattern with respect to the change of the exposure (Continued)

condition satisfying a predetermined condition, and the number of patterns having the same shape as that of the pattern satisfying a predetermined condition.

10 Claims, 11 Drawing Sheets

(51) Int. Cl.
    *G03F 7/20*     (2006.01)
    *H01J 37/28*     (2006.01)

(52) U.S. Cl.
    CPC ............ *H01J 37/28* (2013.01); *H01L 21/027* (2013.01); *G01B 2210/56* (2013.01); *H01J 2237/2817* (2013.01)

(58) Field of Classification Search
    USPC .......................................... 250/306, 307, 311
    See application file for complete search history.

(56) References Cited

U.S. PATENT DOCUMENTS

| | | | |
|---|---|---|---|
| 2003/0219658 A1* | 11/2003 | Shishido | G03F 7/70625 430/30 |
| 2005/0173633 A1 | 8/2005 | Tanaka et al. | |
| 2008/0159609 A1 | 7/2008 | Miyamoto et al. | |
| 2009/0231424 A1 | 9/2009 | Honda et al. | |
| 2012/0151428 A1 | 6/2012 | Tanaka et al. | |
| 2013/0216121 A1 | 8/2013 | Sasajima et al. | |
| 2013/0326439 A1* | 12/2013 | Matsuoka | G01B 15/04 716/55 |

FOREIGN PATENT DOCUMENTS

| | | |
|---|---|---|
| JP | 2008-147143 A | 6/2008 |
| JP | 2009-206453 A | 9/2009 |
| JP | 2010-182895 A | 8/2010 |
| JP | 2012-093202 A | 5/2012 |
| WO | WO 2011/021346 A1 | 2/2011 |

* cited by examiner

[Fig. 1]
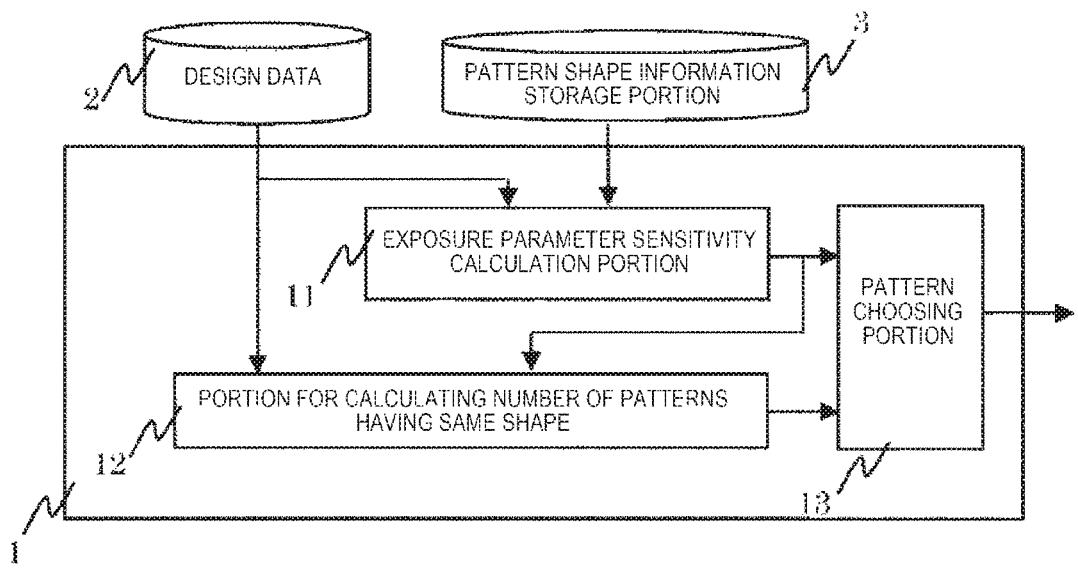
[Fig. 2]
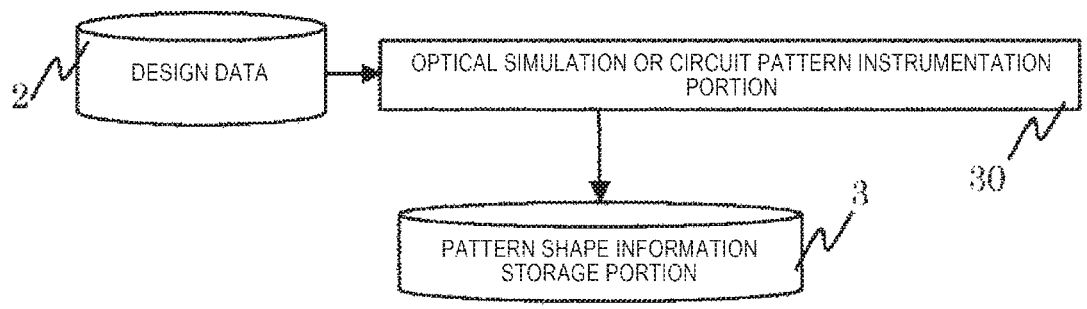

[Fig. 3]
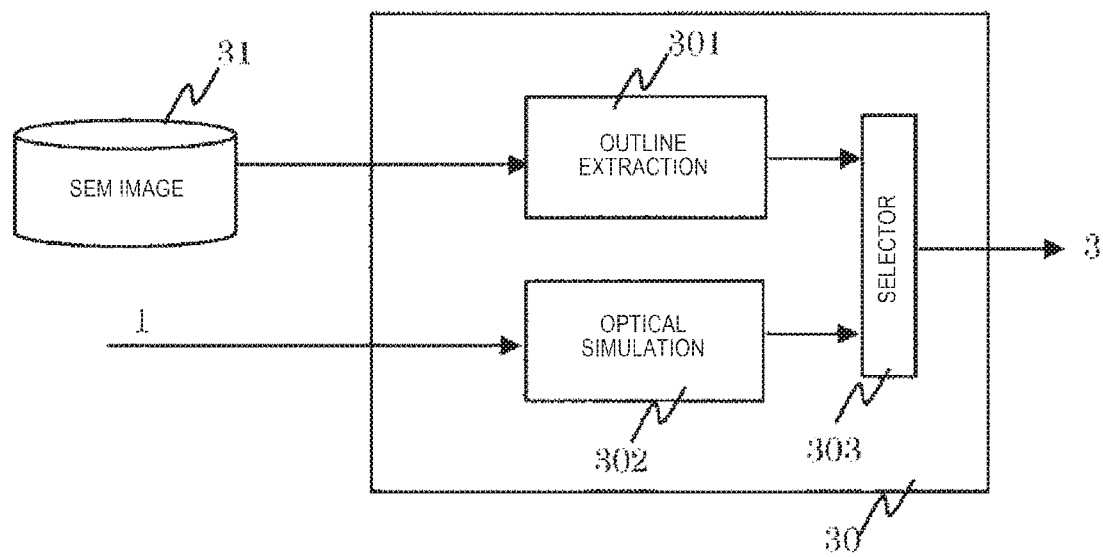
[Fig. 4]
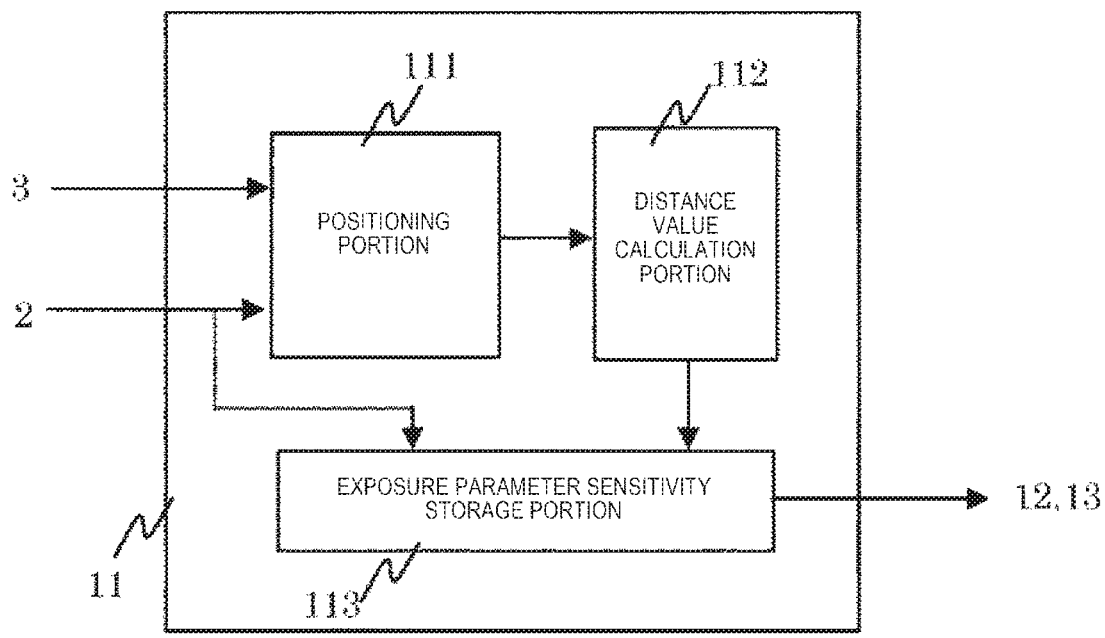

[Fig. 5]
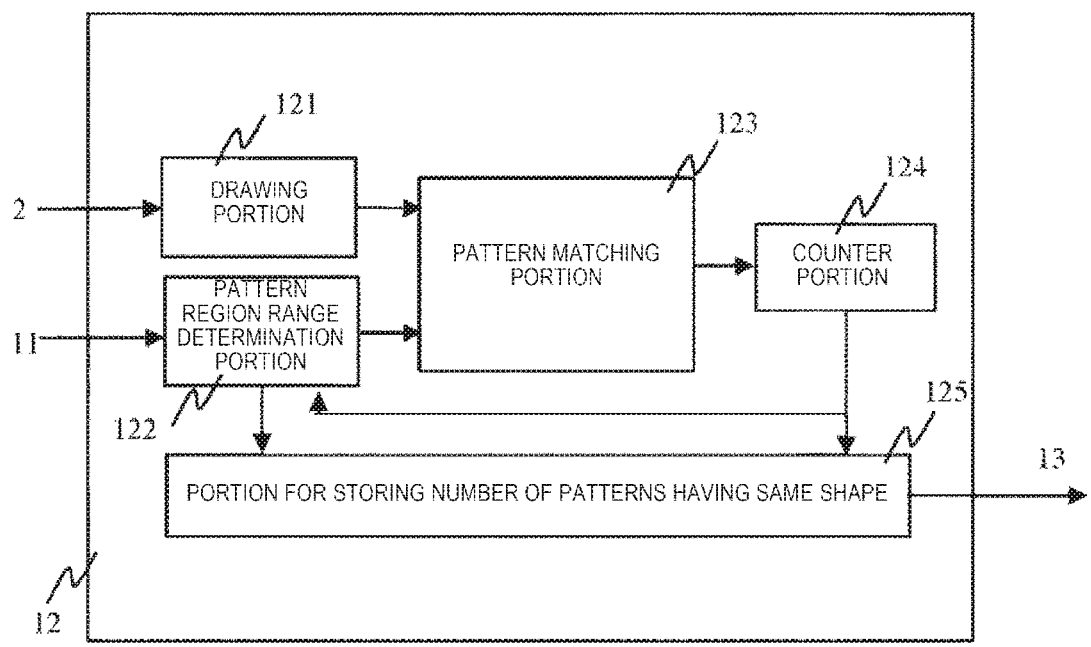
[Fig. 6]
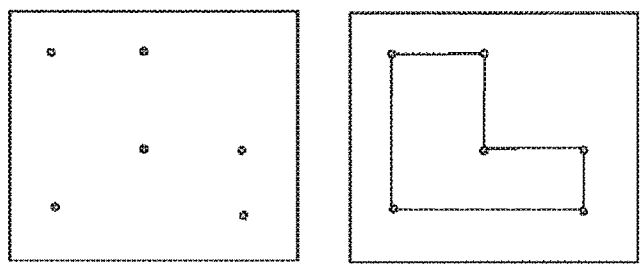

[Fig. 7]
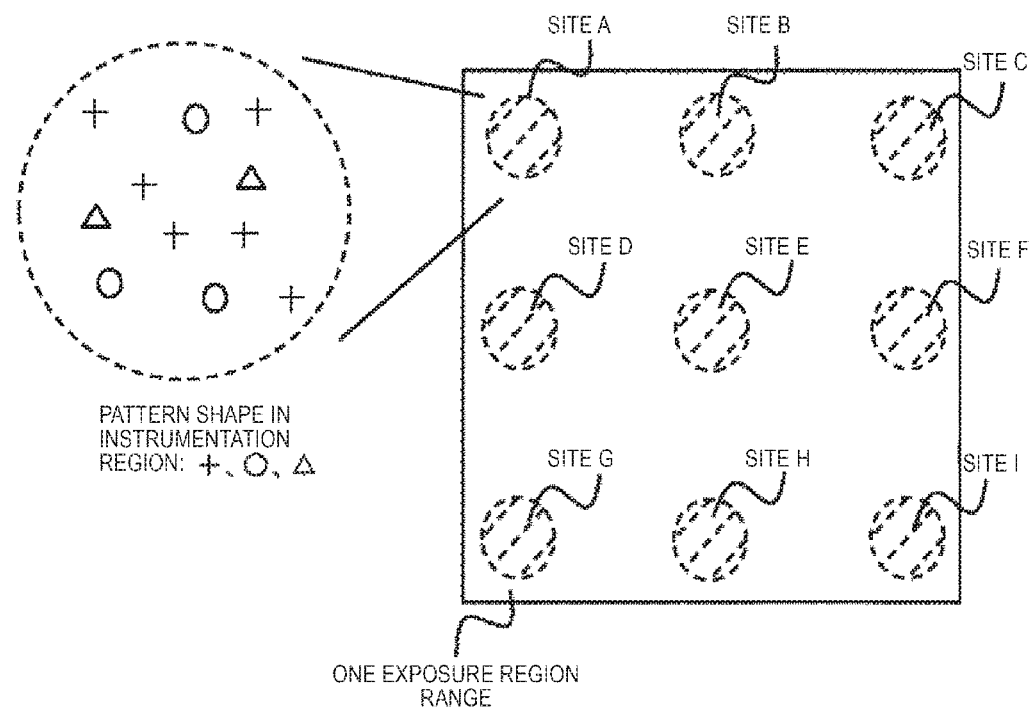
PATTERN SHAPE IN
INSTRUMENTATION
REGION: +, ○, △
ONE EXPOSURE REGION
RANGE
[Fig. 8]
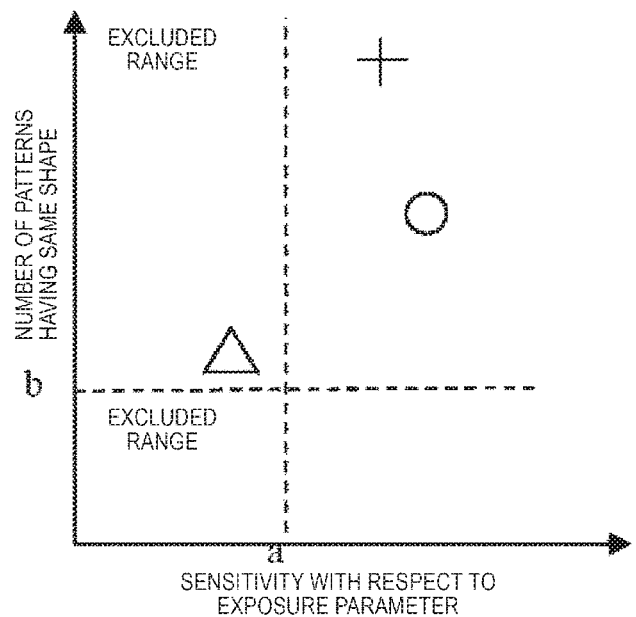

[Fig. 9]
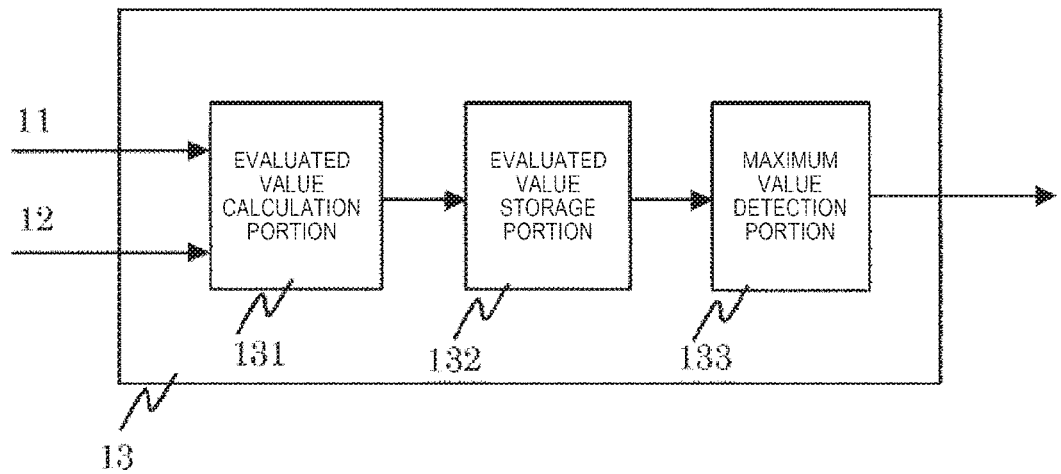
[Fig. 10]
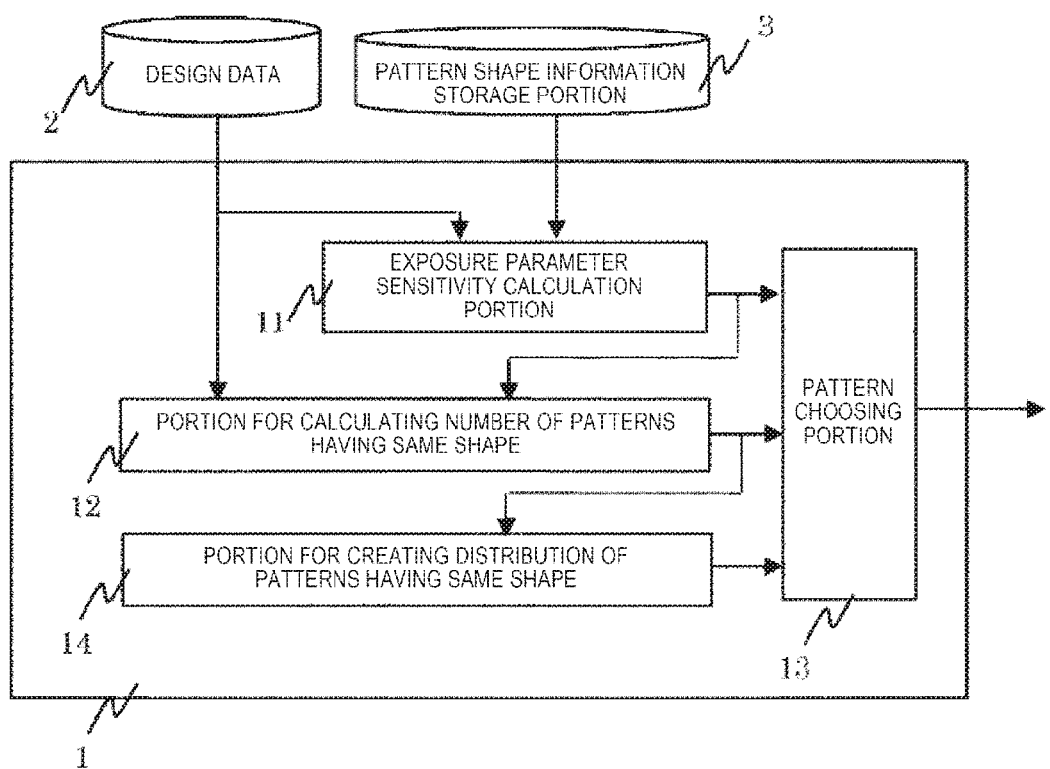

[Fig. 11]
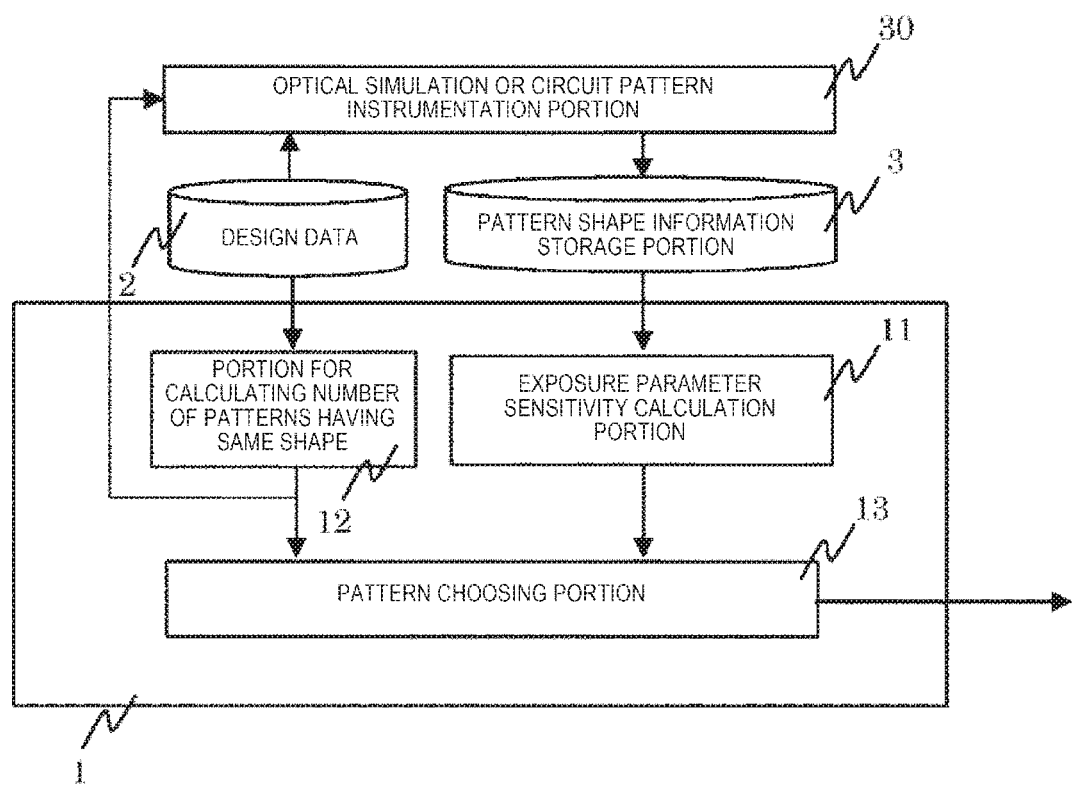

[Fig. 12]
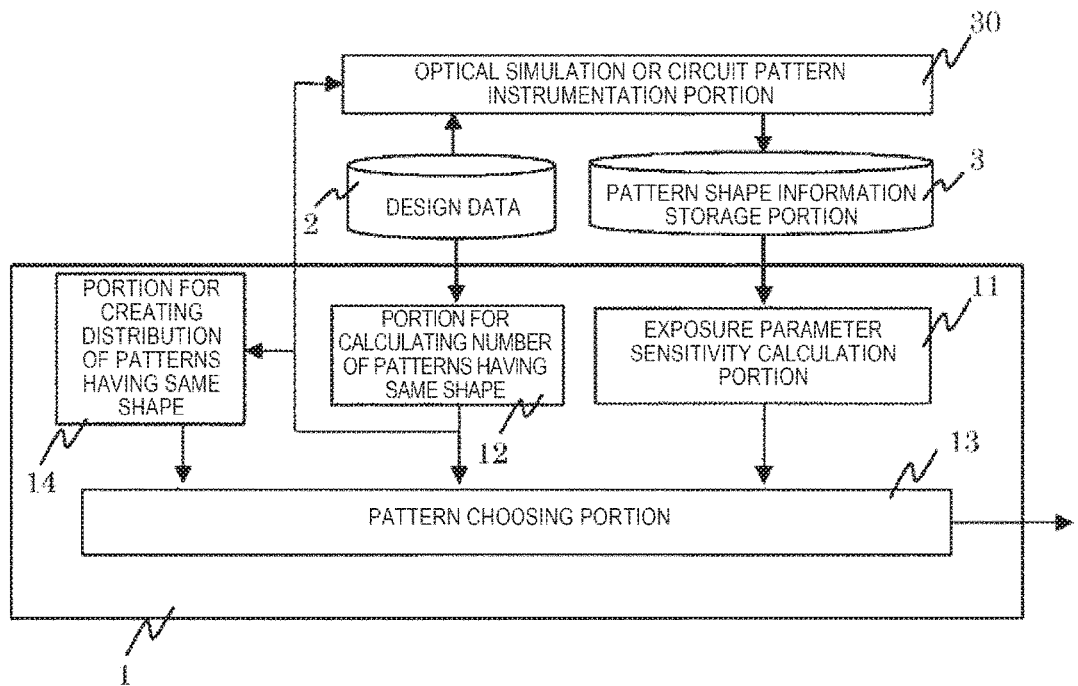
[Fig. 13]
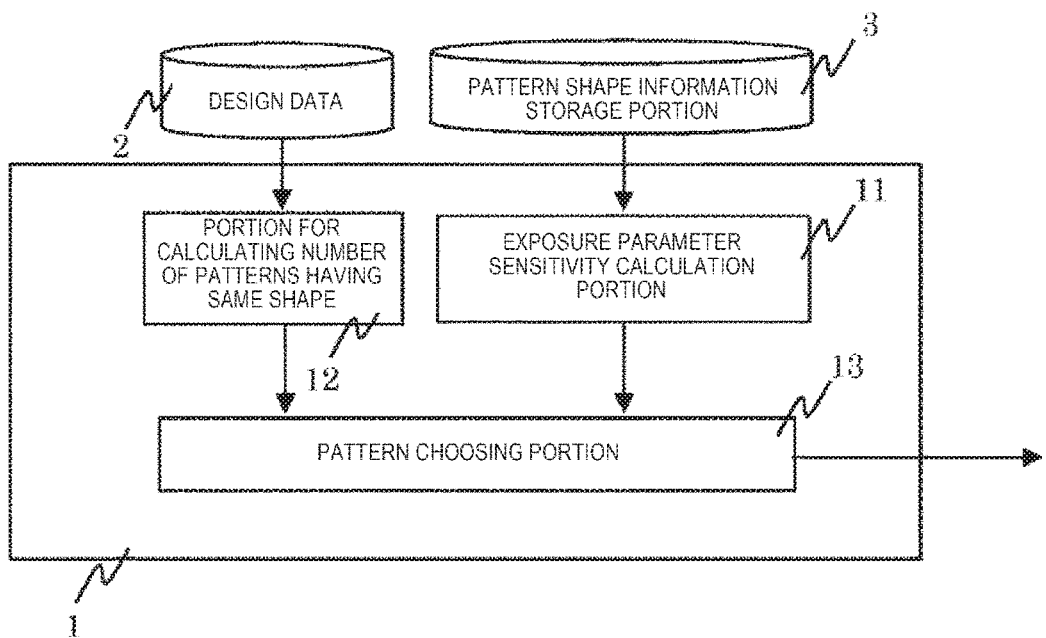

[Fig. 14]
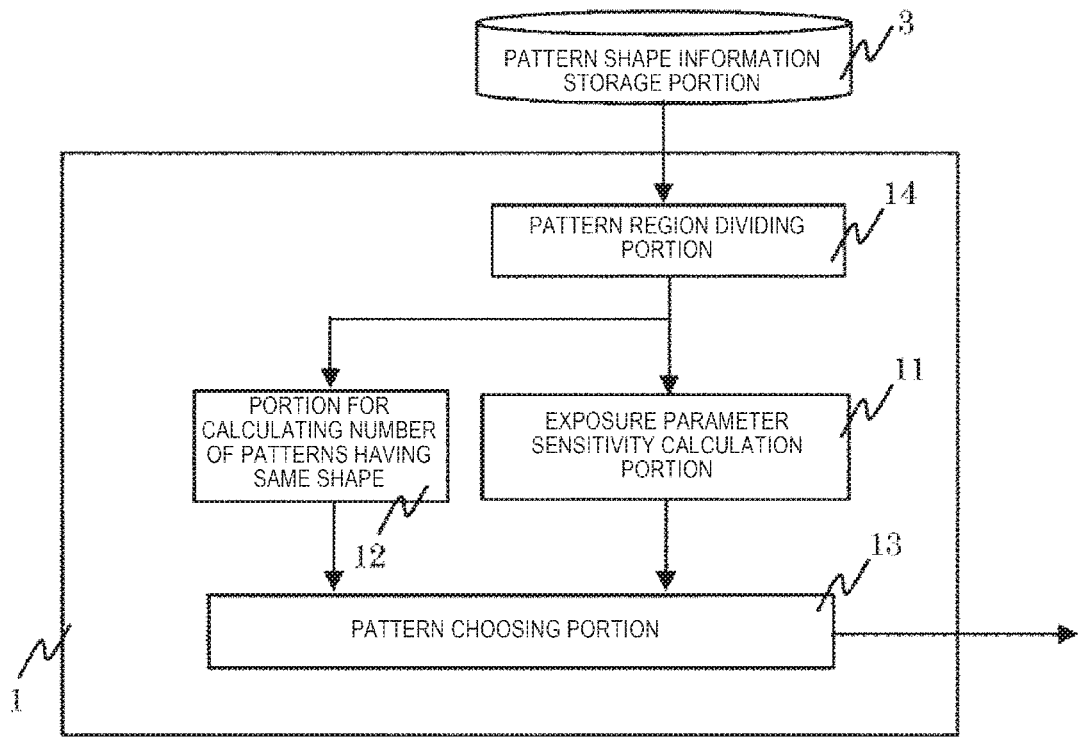
[Fig. 15]
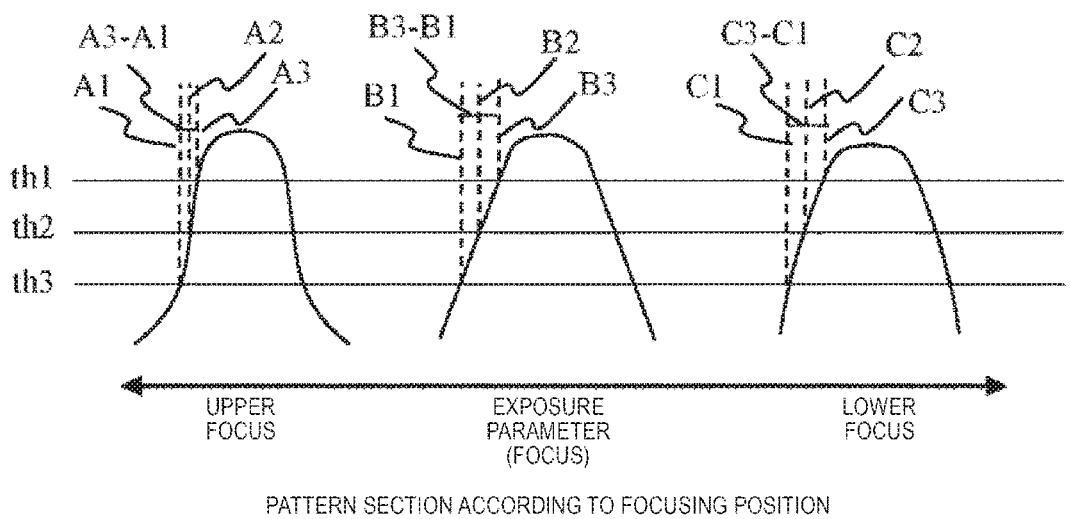
PATTERN SECTION ACCORDING TO FOCUSING POSITION

[Fig. 16]
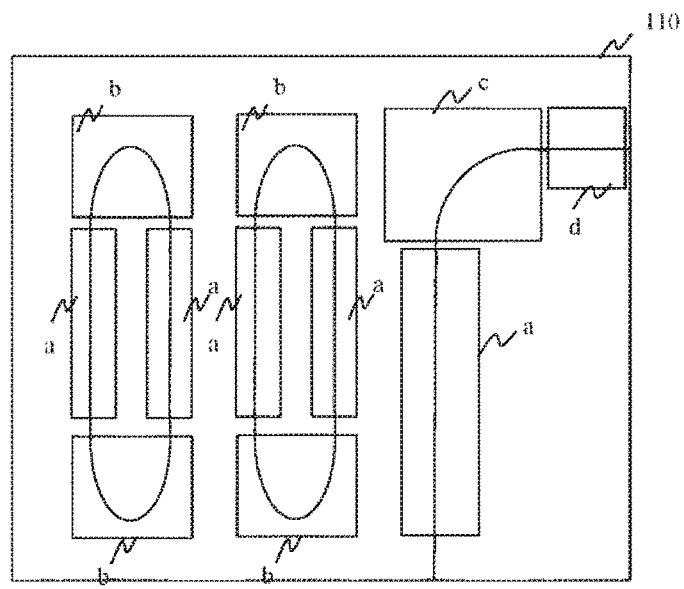
[Fig. 17]
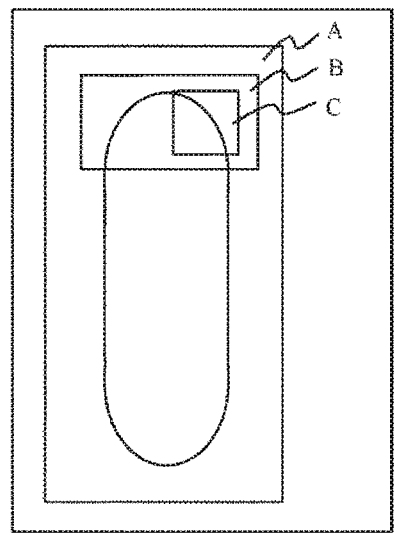

[Fig. 18]
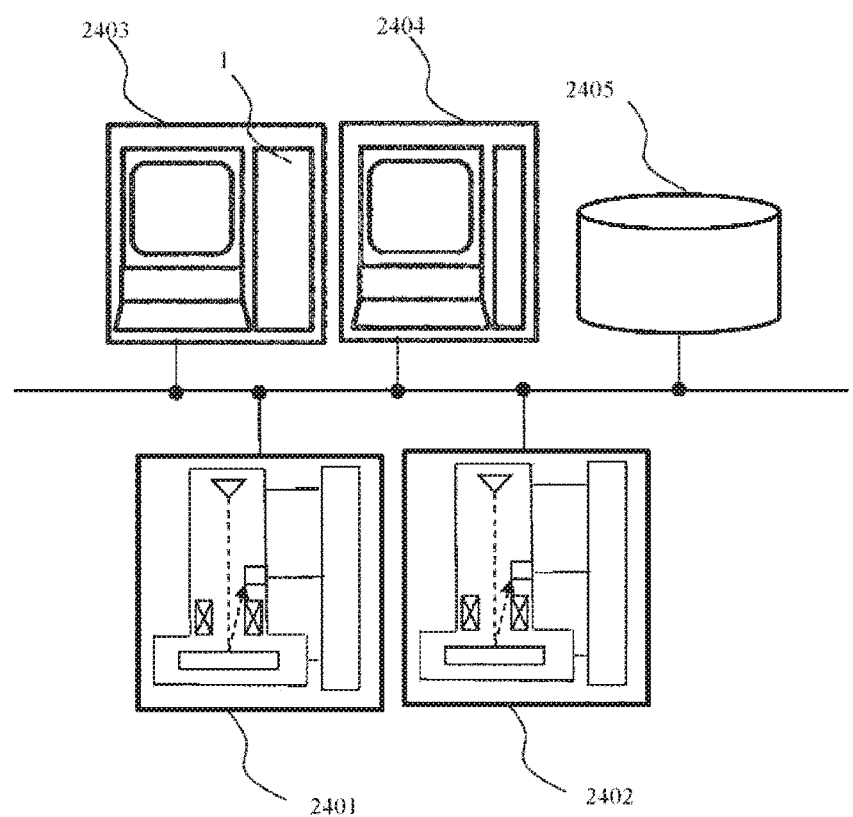

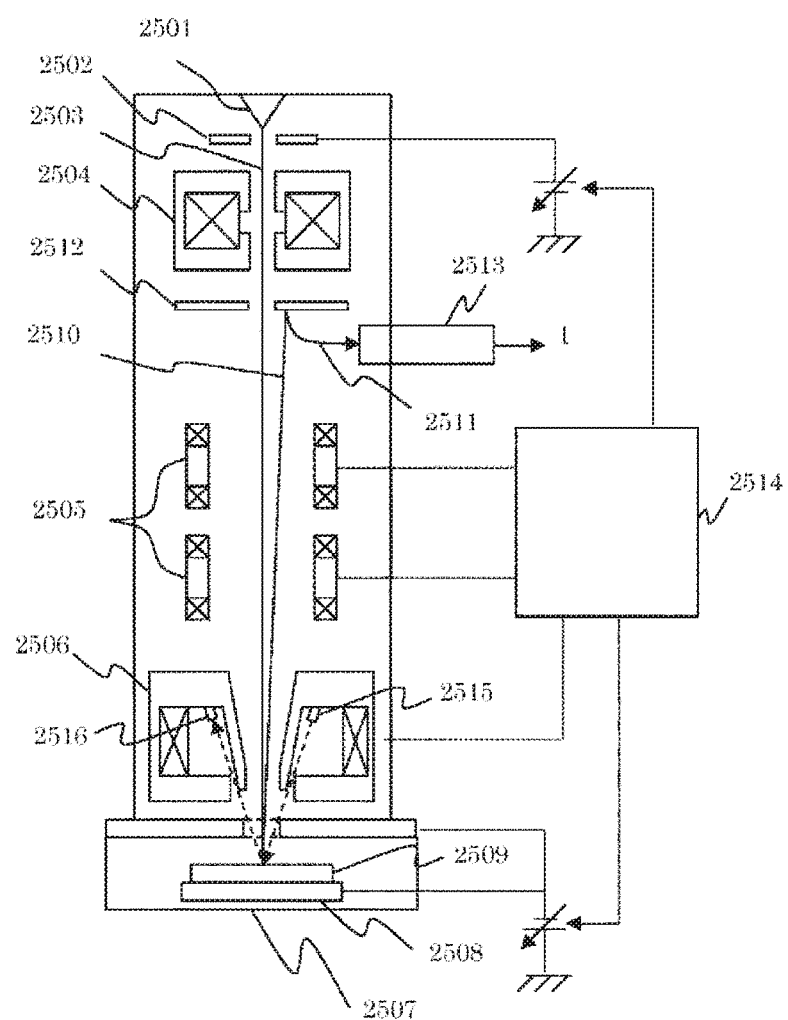
[Fig. 19]

PATTERN MEASUREMENT CONDITION SETTING DEVICE AND PATTERN MEASURING DEVICE

TECHNICAL FIELD

The present invention relates to a pattern measurement condition setting device and a pattern measuring device, and particularly to a device which appropriately selects a pattern measurement condition for evaluating a device condition of a reduced projection exposure device, and a device which executes measurement based on the selection.

BACKGROUND ART

In the related art, in a semiconductor process, by using a length measurement SEM (critical dimension-scanning electron microscope: CD-SEM) as means for evaluating whether or not a formed pattern follows design, a dimension, such as a width of a line pattern or a diameter of a hole, is measured, the pattern shape is managed by the dimension, and as the semiconductor has become finer in recent years, it became necessary to strictly manage the dimension.

A projection exposure method which transfers a semiconductor pattern onto a wafer throws light onto a photomask of a shielding material on which the pattern that is desired to be baked is written, and projects an image of the photomask to a resist on the wafer through a lens system. When performing the exposure by an exposure device, the exposure is performed by determining a focus and an exposure amount which are exposure parameters.

In order to derive an appropriate exposure condition, it is necessary to evaluate the pattern formed based on the exposure by a CD-SEM or the like, and to find out an exposure condition on which the pattern is appropriately formed. Furthermore, it is necessary to appropriately select the pattern which becomes an object to be evaluated. In PTL 1, it is described that an object to be measured of which a pattern shape largely changes is selected in a case where a manufacturing condition is changed.

CITATION LIST

Patent Literature

PTL 1: JP-A-2009-206453 (corresponding U.S. Pat. No. 8,547,429)

SUMMARY OF INVENTION

Technical Problem

In a case where a plurality of patterns having the same shape are formed by the same exposure parameter, when closely examining the pattern, the patterns having completely the same shape rarely exist, and there is some variation. In addition, in a pattern of which a change of the shape is large, variation of the shape is also large. Therefore, when a pattern of which a change of the shape is large is selected, the variation of the pattern shape is large, and thus, there is a case where it is not possible to stably acquire an exposure parameter with high accuracy. Accordingly, when a pattern of which a change of the shape is large with respect to the change of manufacturing condition is simply selected as an object to be evaluated, there is a case where it is not possible to contribute to determining an appropriate exposure condition. In PTL 1, a method for stably selecting a measurement condition regardless of the variation of the pattern shape, is not disclosed.

Hereinafter, a pattern measurement condition setting device which aims at appropriately setting a measurement condition for finding out an appropriate exposure condition, or at executing measurement of a pattern based on the appropriate setting of the measurement condition, and a pattern measuring device, are suggested.

Solution to Problem

According to one aspect for achieving the above-described object, there is provided a pattern measurement condition setting device which sets a pattern measurement condition when the measurement of a pattern is executed based on a detection signal obtained by emitting a charged particle beam to a sample, including: an arithmetic unit which selects a pattern having a predetermined condition from pattern information for each exposure condition obtained when the exposure condition of a reduced projection exposure device is changed or pattern information for each exposure condition obtained when the exposure condition is changed by optical simulation, the arithmetic unit selecting a pattern as an object to be measured or a candidate for the object to be measured, the change of the size or shape of the pattern with respect to the change of the exposure condition satisfying a predetermined condition, and the number of patterns having the same shape as that of the pattern satisfying a predetermined condition.

In addition, according to another aspect for achieving the above-described object, there is provided a pattern measuring device which executes measurement of patterns based on a detection signal obtained by emitting a charged particle beam to a sample, including: an arithmetic unit which selects a pattern having a predetermined condition from pattern information for each exposure condition obtained when the exposure condition of a reduced projection exposure device is changed or pattern information for each exposure condition obtained when the exposure condition is changed by optical simulation, the arithmetic unit measuring a pattern, the change of the size or shape of the pattern with respect to the change of the exposure condition satisfying a predetermined condition, and the number of patterns having the same shape as that of the pattern satisfying a predetermined condition.

Advantageous Effects of Invention

According to the above-described configuration, it is possible to perform selection or measurement of a pattern for deriving an appropriate exposure condition.

BRIEF DESCRIPTION OF DRAWINGS

FIG. 1 is a view illustrating an example of a semiconductor circuit pattern instrumentation system.

FIG. 2 is a view illustrating an example of a pattern instrumentation portion.

FIG. 3 is a view illustrating an example of an outline extraction portion.

FIG. 4 is a view illustrating an example of an exposure parameter sensitivity calculation portion.

FIG. 5 is a view illustrating an example of a portion for calculating the number of patterns having the same shape.

FIG. 6 is a view illustrating an overview of a design data drawing portion.

FIG. 7 is a view illustrating an overview of an instrumentation region of exposure parameters in an exposure range.

FIG. 8 is a view illustrating an overview of a pattern choosing portion.

FIG. 9 is a view illustrating an example of the pattern choosing portion.

FIG. 10 is a view illustrating an example of the semiconductor circuit pattern instrumentation system.

FIG. 11 is a view illustrating an example of the semiconductor circuit pattern instrumentation system.

FIG. 12 is a view illustrating an example of the semiconductor circuit pattern instrumentation system.

FIG. 13 is a view illustrating an example of the semiconductor circuit pattern instrumentation system.

FIG. 14 is a view illustrating an example of the semiconductor circuit pattern instrumentation system.

FIG. 15 is a view illustrating a change of a shape of patterns with respect to the exposure parameters.

FIG. 16 is a view illustrating an overview of a pattern segmentation in an SEM image.

FIG. 17 is a view illustrating an overview of a pattern region range setting portion.

FIG. 18 is a view illustrating an example of a semiconductor instrumentation system.

FIG. 19 is a schematic explanation view of a scanning electron microscope.

DESCRIPTION OF EMBODIMENTS

When exposing light by an exposure device, light is exposed by determining a focus and an exposure amount which are exposure parameters, but when there is unevenness on a surface of a resist due to irregularity of resist coating, there is a case where the focus and the exposure amount which are exposure parameters are shifted, a dimension or a shape of a transferred pattern changes, and a normal pattern is not achieved.

In addition, the focus of the exposure parameters is also shifted by non-flatness caused by a photomask or an aberration of a lens. Since the shift of the exposure parameters caused by the resist coating, the photomask, and the lens aberration has reproducibility, by instrumenting and evaluating the shape of the pattern formed on a wafer by a semiconductor instrumenting device by the exposure in advance, it is possible to acquire the shift of the exposure parameters, to feed back to an exposure machine, and to correct the shift. According to the method, it is possible to correct the shift of the exposure parameters caused by the resist coating, the photomask, and the aberration of the lens, and to suppress unevenness of dimension of the patterns.

It is considered that the pattern to be used when acquiring the exposure parameter is elaborated on the wafer as a dedicated pattern for instrumentation, but since the dedicated pattern is restricted to an elaborating place, it is also considered that the instrumentation is performed by using a circuit pattern formed on the wafer without using the dedicated pattern, and the exposure parameter is acquired.

In recent years, measures, such as matching an illumination condition of the exposure so that the pattern shape is not collapsed by some variations of the exposure parameter, or providing a non-resolution pattern, is performed, and the shape change of a circuit pattern having a large radius is also suppressed to be small with respect to the variation of the exposure parameter. It is difficult to acquire the exposure parameter with high accuracy when there is not a change of the shape of the pattern with respect to the variation of the exposure parameter. However, since matching of the illumination condition of the exposure cannot be matching in all of the circuit patterns, in the circuit pattern of a part which is not matched, a change of the shape is large with respect to the variation of the exposure parameter.

Therefore, it is considered that the circuit pattern is formed by practically changing the exposure parameter, a pattern having a large shape change is determined, and the pattern is used as a pattern for instrumentation of the exposure parameter. In this case, since the pattern in which a shape change is large (there is sensitivity of the change of exposure parameters) is used with respect to the change of the exposure parameter, it is possible to acquire the exposure parameter by selecting a pattern which does not have a change.

Meanwhile, when comparing the pattern in which a change of the shape is large with another pattern, the pattern is a pattern having a relatively large unevenness. When the unevenness of the shape is large, even when the pattern is formed under the same exposure condition, the possibility of forming different shapes of patterns increases, and as a result, there is a case where it is difficult to acquire an appropriate exposure condition.

Here, in the example which will be described in the following, a pattern measurement condition setting device which can find out a measurement condition which suppresses deterioration of evaluation accuracy caused by the unevenness of the pattern shape while performing a pattern evaluation by the pattern in which a shape change is large, and a pattern measuring device which can measure a pattern under an appropriate measurement condition are explained.

In the example, for example, as semiconductor circuit pattern instrumentation system which acquires the exposure parameter including a focus value when forming a semiconductor pattern from an image captured by using an electron beam, a semiconductor circuit pattern instrumentation system including: exposure parameter sensitivity calculation means for calculating the size of the change of pattern shape with respect to the change of exposure parameter by using an optical simulation result or information on the pattern shape formed by changing the exposure parameter; means for calculating the number of patterns having the same shape for acquiring the number of patterns having the same shape based on the design data; and pattern choosing means for choosing the pattern shape for instrumenting the exposure parameter by using the output result of the exposure parameter sensitivity calculation means and the output result of the means for calculating the number of patterns having the same shape, is suggested.

In addition, as the pattern choosing means, pattern choosing means which acquires an evaluated value for instrumenting the exposure parameter by using the information based on the size of the change of pattern shape with respect to the change of the exposure parameter, and the information on the number of patterns having the same shape, is suggested.

In addition, as the pattern choosing means, a semiconductor circuit pattern instrumentation system in which patterns of which the size of the change of the pattern shape with respect to the change of the exposure parameter and the number of patterns having the same shape are respectively less than a specific value, are excluded from the pattern shape for instrumenting the exposure parameter, is suggested.

In addition, a semiconductor circuit pattern instrumentation system in which the instrumentation region is changed in a case where there is not a pattern which is appropriate for the instrumentation region, is suggested.

In addition, as the means for calculating the number of patterns having the same shape, means for calculating the number of patterns having the same shape in which the patterns having the same shape are detected while changing the size of the pattern shape region, is suggested.

In addition, as the semiconductor circuit pattern instrumentation system which acquires the exposure parameter including the focus value when forming the semiconductor pattern from the image captured by using the electron beam, a semiconductor circuit pattern instrumentation system in which the pattern shape is narrowed down to an arbitrary number, by the means for calculating the number of patterns having the same shape for acquiring the number of patterns having the same shape for each instrumentation region of the exposure parameter based on the design data, and the size of the change of pattern shape with respect to the change of exposure parameter is calculated by the exposure parameter sensitivity calculation means by using the optical simulation result with respect to the narrowed-down pattern shape, and the information on the pattern shape formed by changing the exposure parameter, is suggested.

In addition, as the semiconductor circuit pattern instrumentation system which acquires the exposure parameter including the focus value when forming the semiconductor pattern from the image captured by using the electron beam, a semiconductor circuit pattern instrumentation system including: exposure parameter sensitivity calculation means for calculating the size of the change of pattern shape with respect to the change of exposure parameter by using an optical simulation result or information on the pattern shape formed by changing the exposure parameter for each instrumentation region of the plurality of exposure parameters; means for calculating the number of patterns having the same shape for acquiring the number of patterns having the same shape included in a plurality of instrumentation regions based on the design data; distribution creating means for acquiring the distribution of the plurality of instrumentation regions of the number of patterns acquired by the means for calculating the number of patterns having the same shape; and pattern choosing means for choosing the pattern shape for instrumenting the exposure parameter by using the information based on the output of the exposure parameter sensitivity calculation means, information based on the output of the means for calculating the number of patterns having the same shape, and the information based on the output of the distribution creating means, is suggested.

In addition, as the pattern choosing means, a pattern choosing means in which the evaluated value for instrumenting the exposure parameter is acquired by using the information based on the size of change of pattern shape with respect to the change of exposure parameter for each instrumentation region, the information on the number of patterns having the same shape, and the information of the distribution of the patterns having the same shape of the instrumentation region, is suggested.

In addition, as the pattern choosing means, a pattern choosing means which chooses a plurality of patterns for instrumenting the exposure parameter by using the information based on the size of the change of pattern shape with respect to the change of exposure parameter for each instrumentation region, the information on the number of patterns having the same shape, and the information of the distribution of the patterns having the same shape of the instrumentation region, and changes the patterns by the instrumentation region, is suggested.

In addition, as the pattern choosing means, a pattern choosing means which chooses a plurality of equivalent patterns in the instrumentation region of the exposure parameter based on the output information of the distribution creating means, is suggested.

In addition, as the semiconductor circuit pattern instrumentation system which acquires the exposure parameter including the focus value when forming the semiconductor pattern from the image captured by using the electron beam, a semiconductor circuit pattern instrumentation system which chooses the pattern for instrumenting the exposure parameter by acquiring the evaluated value based on the plural pieces of information including the number of patterns having the same shape for each instrumentation region of the exposure parameter, is suggested.

As one aspect for choosing the pattern from the patterns in an SEM image obtained by capturing the circuit pattern, hereinafter, as a semiconductor circuit pattern instrumentation system which acquires the exposure parameter including the focus value when forming the semiconductor pattern from the image captured by using the electron beam, a semiconductor circuit pattern instrumentation system including: exposure parameter sensitivity calculation means for obtaining the pattern formed by changing the exposure parameter by capturing the SEM image, for acquiring the shape of the pattern, for dividing the patterns in the image into a plurality of pattern regions, and for calculating the size of the change of pattern shape of the pattern region with respect to the change of exposure parameter; means for calculating the number of patterns having the same shape for acquiring the number of patterns having the same shape based on the design data; and pattern choosing means for choosing the pattern shape for instrumenting the exposure parameter by using the output result of the exposure parameter sensitivity calculation means and the output result of the means for calculating the number of patterns having the same shape, is suggested.

In addition, as one aspect for choosing the pattern without using the design data from the pattern in the SEM image obtained by capturing the circuit pattern, hereinafter, as the semiconductor circuit pattern instrumentation system which acquires the exposure parameter including the focus value when forming the semiconductor pattern from the image captured by using the electron beam, a semiconductor circuit pattern instrumentation system including: exposure parameter sensitivity calculation means for obtaining the pattern formed by changing the exposure parameter by capturing the SEM image, for acquiring the shape of the pattern, for dividing the patterns in the image into a plurality of pattern regions, and for calculating the size of the change of pattern shape of the pattern region with respect to the change of exposure parameter; means for calculating the number of patterns having the same shape for acquiring the pattern shape of the pattern region in the image, and the number of patterns having the same shape based on the design data; and pattern choosing means for choosing the pattern shape for instrumenting the exposure parameter by using the output result of the exposure parameter sensitivity calculation means and the output result of the means for calculating the number of patterns having the same shape, is suggested.

According to the above-described configuration, there is sensitivity of change of exposure parameter, and by using the circuit pattern having a large averaging effect, it is possible to stably acquire the focus value with high accuracy.

The semiconductor circuit pattern instrumentation system and the image evaluating device which are illustrated as an example in the example which will be described hereinafter, are related to the semiconductor circuit pattern instrumentation system for monitoring the exposure parameter including the focus from the image data of a curved pattern obtained by capturing the SEM image. In addition, as a specific example, an example in which the circuit pattern for detecting the exposure parameter including the focus is chosen, is illustrated.

In addition, an example in which the evaluated value for choosing the circuit pattern which detects the exposure parameter including the focus is acquired, is illustrated. Hereinafter, the device having a function of choosing the circuit pattern for detecting the exposure parameter including the focus, and the circuit pattern instrumentation system, will be described by using the drawings. More specifically, a device and a system including the CD-SEM which is one type of the measuring device, will be described.

In addition, in the following description, an example in which a charged particle beam device which serves as a device that forms the image is illustrated as an example, and as one aspect thereof, an example in which the SEM is used is described, but not being limited thereto, for example, a focused ion beam (FIB) device which forms an image by scanning an ion beam on a sample, may be employed as a charged particle beam device. However, since an extremely high magnification is required in order to measure the pattern which has become fine with high accuracy, it is desirable to use an excellent SEM which is superior to the FIB device in terms of resolution in general.

FIG. 18 is a schematic explanation view of an inspection system which performs plural measurements, or measurement in which an inspection device is connected to a network. In the system, a configuration in which, mainly, a CD-SEM 2401 which measures a pattern dimension of a semiconductor wafer or a photomask, and a flaw inspection device 24023 which extracts a flaw based on comparison of the image and a reference image registered in advance with each other by obtaining the image, by emitting the electron beam to the sample, are connected to the network, is employed. In addition, a condition setting device 2403 which sets a measurement position or a measurement condition on the design data of the semiconductor device, a simulator 2404 which simulates workmanship of the pattern based on the design data of the semiconductor device and a manufacturing condition of the semiconductor manufacturing device, and a storage medium 2405 which stores layout data of the semiconductor device or the design data in which the manufacturing condition is registered, are connected to the network.

The design data is expressed, for example, in a GDS format or an OASIS format, and is stored in a predetermined form. In addition, the type of the design data does not matter as long as software which displays the design data can display the format form, and can be handled as figure data. In addition, the storage medium 2405 may be embedded in the measuring device, a control device of the inspection device, or the condition setting device 2403, and the simulator 2404. In addition, in the CD-SEM 2401 and the flaw inspection device 2402, the control devices are respectively provided, and the control necessary for each device is performed, but in the control devices, a function of the simulator or a function for setting the measurement condition or the like, may be loaded.

In the SEM, the electron beam discharged by the electron source is focused by a multistage lens, and at the same time, the focused electron beam is scanned one-dimensionally or two-dimensionally on the sample by a scanning deflector.

A secondary electron (SE) discharged by the sample by the scanning of the electron beam or a backscattered electron (BSE), is detected by a detector, is synchronized with the scanning of the scanning deflector, and is stored in a storage medium, such as a frame memory. The image signal stored in the frame memory is estimated by an arithmetic unit loaded on the inside of the control device. In addition, the scanning is possible by the scanning deflector with respect to an arbitrary size, position, and direction.

The above-described control or the like is performed by the control device of each SEM, and as a result of scanning the electron beam, the obtained image or signal is sent to the condition setting device 2403 via a communication circuit network. In addition, in the example, the control device which controls the SEM is described as a body separated from the condition setting device 2403, but not being limited thereto, the control of the device and measurement processing may be performed integrally by the condition setting device 2403, or the control of the SEM and the measurement processing may be performed being combined by each control device.

In addition, in the above-described condition setting device 2403 or the control device, a program for executing the measurement processing is stored, and the pattern measurement or the arithmetic operation may be performed in accordance with the program.

In addition, the condition setting device 2403 has a function of creating a program (recipe) which controls the operation of the SEM based on the design data of the semiconductor, and functions as a pattern measurement condition setting device. Specifically, the position or the like for performing necessary processing by the SEM of a desirable measurement point, autofocus, autostigma, or an addressing point on the design data, the outline data of the pattern, or the design data to which the simulation is performed, is set, and a program for automatically controlling a sample stage or the deflector of the SEM is created based on the setting. In addition, in order to create a template which will be described later, information of a region which becomes the template is extracted from the design data, and a processor which creates the template or a program for creating the template in a general processor, is embedded or stored based on the extracted information.

FIG. 19 is a schematic configuration view of a scanning electron microscope. An electron beam 2503 which is led out by a lead-out electrode 2502 from an electron source 2501, and which is accelerated by an acceleration electrode which is not illustrated is scanned one-dimensionally or two-dimensionally on a sample 2509 by a scanning deflector 2505 after being narrowed down by a condensing lens 2504 which is one aspect of the focusing lens. The electron beam 2503 is decelerated by a negative voltage applied to the electrode embedded in a sample stand 2508, and is emitted onto the sample 2509 being focused by a lens action of an objective lens 2506.

When the electron beam 2503 is emitted to the sample 2509, a secondary electron and an electron 2510 similar to a backscattered electron are discharged from the emission location. The discharged electron 2510 is accelerated in the electron source direction by an acceleration action based on the negative voltage applied to the sample, collides with a conversion electrode 2512, and generates a secondary electron 2511. The secondary electron 2511 discharged from the conversion electrode 2512 is caught by a detector 2513, and an output I of the detector 2513 changes due to an amount of the caught secondary electrons. Brightness of a display device which is not illustrated changes in accordance with the output I. For example, in a case where a secondary image is formed, by synchronizing a deflection signal to the scanning deflector 2505 and the output I of the detector 2513 with each other, the image of the scanning region is formed. In addition, in the scanning electron microscope illustrated as an example in FIG. 19, a deflector (not illustrated) which moves in the scanning region of the electron beam is provided.

In addition, in the example of FIG. 19, an example in which one end of the electron discharged from the sample is converted by a conversion electrode and is detected, is described, but it is needless to say that the configuration is not limited to the configuration, and for example, a configuration in which a detection surface of an electron multiplication image pipe or a detector is disposed on a track of the accelerated electron, is also possible. A control device 2514 controls each configuration of the scanning electron microscope, and at the same time, has a function of forming the image based on the detected electron or a function of measuring the pattern width of the pattern formed on the sample based on a strength distribution of the detected electron which is called a line profile.

Next, one aspect of the circuit pattern instrumentation system for choosing the circuit pattern for acquiring the exposure parameter including the focus, will be described. A circuit pattern instrumentation system 1 can also be executed by the arithmetic unit which is embedded in the condition setting device 2403 of FIG. 18 or has image processing embedded therein, or can also execute image evaluation by the external arithmetic unit (for example, the condition setting device 2403) via the network.

FIG. 1 is a view illustrating an example of the instrumentation system 1 which chooses the instrumentation circuit pattern for detecting the exposure parameter including the focus based on the design data. The information on the shape of the pattern formed when the exposure parameter is changed in advance with respect to the region in which the exposure parameter is instrumented, is stored in a pattern shape information storage portion 3, and the pattern region in which a shape is largely changed when the exposure parameter is changed is acquired by an exposure parameter sensitivity calculation portion 11. In a case where the shape is largely changed, the sensitivity of the exposure parameter increases.

In addition, the number of regions of the patterns in which the sensitivity of the acquired exposure parameter is high is not limited to 1, and a plurality of regions are acquired. It is considered that a plurality of regions which largely changes are selected in an order from the largest change, and the number thereof is set to be arbitrary. In addition, based on the design data with respect to the pattern shape of the selected pattern region, the same pattern shape in the region instrumented by a portion for calculating the number of patterns having the same shape 12 is detected, and the number thereof is calculated. Since there are the plurality of selected pattern regions, the number of patterns having the same shape of each pattern shape of the plurality of pattern regions, is acquired. In addition, by using the value based on the acquired number of patterns having the same shape, and the change of pattern shape with respect to the exposure parameter, one pattern region, that is, a pattern shape is chosen from the pattern shapes of the plurality of selected pattern regions selected by a pattern choosing portion 13.

The information on the shape of the pattern formed when the exposure parameter stored in the pattern shape information storage portion 3 in advance is changed, can acquire the shape of the pattern formed when the exposure parameter is changed by using the optical simulation from the design data as illustrated in FIG. 2. Regarding the focus, the exposure parameters are, for example, 9 exposure parameters, such as −60 nm, −45 nm, −30 nm, . . . 60 nm, which are changed to +60 nm in units of 15 nm to −60 nm using the best focus as a reference, and each piece of information on the pattern shape with respect to the 9 exposure parameters, are acquired. For example, as illustrated in FIG. 15, it is known that the shape of the section of the pattern changes when the focus which is the exposure parameter changes. By the optical simulation, the formed pattern is created, and using this as an example, it is possible to acquire a side wall position when being sliced by a height of th1 as an edge pixel, and to acquire the shape of the pattern by linking. The width of the pattern of the pattern shape created by the slicing by th1 becomes narrow, and the width of the pattern of the pattern shape created by the slicing by th3 becomes thick. The difference thereof becomes B3−B1. As the focus changes, the difference between the pattern shape created by th1 and the pattern shape created by th3 changes to A3−A1 and C3−C1. The pattern of which the difference between A3−A1 and C3−C1 becomes large is called a pattern having a high sensitivity of the exposure parameter.

As described above, by providing the arithmetic unit (in a case of the example, the instrumentation system 1) which selects the pattern having a predetermined condition (the sensitivity is high, and the number of patterns having the same shape exceeds a predetermined number) as an object to be measured or as a candidate for the object to be measured, from the pattern information (one-dimensional dimension information, two-dimensional shape information or the like) for each different exposure condition, it is possible to select an appropriate pattern for performing appropriate exposure condition evaluation.

In addition, it is also conceived that the pattern shape is acquired not only by the pattern acquired from the optical simulation as illustrated in FIG. 3, but also by practically forming a pattern on the wafer by changing the exposure parameter and acquiring the outline of the pattern from the SEM image captured by the SEM. Any of these may be selected by a selector. The extraction of the outline is binarized by performing the edge detection, and can be realized by making the line thin. Since this is a known technology, the description thereof will be omitted.

An example of the exposure parameter sensitivity calculation portion 11 is illustrated in FIG. 4. In the exposure parameter sensitivity calculation portion 11, the size of the pattern region in which the pattern shape is largely changed when the exposure parameter is changed, and the size of the shape change thereof are acquired. Positioning of the design data and the pattern shape which is a reference is performed by a positioning portion 111, the total value of the shape difference is acquired by a distance value calculation portion 112 by acquiring the shape difference for 1 pixel, and the total value of the pattern region and the shape difference is stored in an exposure parameter sensitivity storage portion 113. A pattern shape in which total distance value is large, stores n upper total distance values in the exposure parameter sensitivity calculation portion 11 as a pattern shape in which the shape change is large with respect to the change of exposure parameter. The positioning is performed by using the pattern matching. In addition, it is also considered that the positioning is performed by acquiring a centroid of an image.

When performing the positioning, two types of the shape differences are acquired. The pixels which correspond to each pixel are acquired, and the distance value thereof is acquired. The technology of acquiring the shape difference is a known technology, and the description thereof will be omitted. The shape which becomes a reference may not be the design data, or may be the pattern shape of a certain exposure parameter. The shape may be the pattern shape created by the simulation.

In FIG. 5, an example of the portion for calculating the number of patterns having the same shape 12 is illustrated. Here, with respect to the plurality of pattern shapes having a sensitivity of the exposure parameter acquired by the exposure parameter sensitivity calculation portion 11, by using the design data, the number of patterns having the same shape in the region to be instrumented is calculated. Design data 2 of a range which corresponds to the region to be instrumented is drawn by a drawing portion 121, and by a pattern region range determination portion 122, the pattern region having the pattern information acquired by the exposure parameter sensitivity calculation portion 11 is determined. In a pattern matching portion 123, in the determined pattern region, by the pattern recognition which used the pattern matching, the patterns having the same shape are identified.

When there is a pattern, by performing the addition by a counter portion 124, the number of regions of the patterns having the same shape is acquired. The number of patterns having the same shape acquired by the counter portion 124 is stored in a portion for storing the number of patterns having the same shape 125 together with the information of the pattern region of the pattern region range determination portion. In a case where the counted value is small, the range is narrowed by the pattern region range determination portion, and the number of regions of the patterns having the same shape is acquired again.

In FIG. 17, an overview in which the pattern range is narrowed by the pattern region range determination portion is illustrated. In the pattern region of A of FIG. 17, the entire one rectangular pattern is illustrated, but the region becomes a region of a line end when the region becomes narrow in the pattern region of B, and there is a possibility that the number of patterns increases. In addition, the region becomes a corner portion when the region becomes narrower in the pattern region of C, and by narrowing the region to a smaller pattern, it is considered that there is a possibility that the number of patterns having the same shape increases.

In FIG. 6, an example in which the design data is drawn is illustrated. In the design data, vertex coordinates of the rectangular pattern are written, and a rectangular image which corresponds to the pattern shape is achieved when the vertex coordinates are linked to each other. In FIG. 7, a region in which the exposure parameter is instrumented with respect to one exposure range is illustrated. Since a shift position of the exposure parameter is not determined, there are needs for the instrumentation in various places. Here, the instrumentation is performed in 9 regions from a site A to a site I in the exposure region. One site is a region of an angle of several μm, and includes various patterns. As described above, when the number of patterns having the same shape is counted for each of the plural patterns, in the instrumentation region site A, there are 6 + patterns, 3 O patterns, and 2 Δ patterns.

In FIG. 8, a concept of the choosing method of the pattern choosing portion 13 is illustrated. The pattern is chosen based on the sensitivity with respect to the exposure parameter and the number of patterns having the same shape. In the pattern which does not have the sensitivity with respect to the exposure parameter, it is not possible to acquire the exposure parameter. In addition, when the sensitivity with respect to the exposure parameter increases, the unevenness also increases. As this time, it is not possible to expect an averaging effect of the plural number when there is not the number of the patterns having the same shape in the instrumentation region, and it is not possible to acquire the exposure parameter with high accuracy. Therefore, the pattern is chosen by using the two indexes, such as the sensitivity with respect to the exposure parameter and the number of patterns having the same shape.

In FIG. 9, the example of the pattern choosing portion 13 is illustrated. In an evaluated value calculation portion 131, the total value of the shape difference of the patterns when the exposure parameter output from the exposure parameter sensitivity calculation portion 11 is changed, and the evaluated value from the output number of patterns having the same shape in the instrumentation region in the portion for calculating the number of patterns having the same shape 12, are acquired. The acquired evaluated value is stored in an evaluated value storage portion 132, and the pattern which becomes the maximum evaluated value is acquired by a maximum value detection portion 133 from the stored evaluated values. In the evaluated value calculation portion 131, it is considered that a value obtained by weighting and adding each of the sensitivity (the total value of the shape difference) with respect to the exposure parameter and the number of patterns having the same shape by the evaluated value calculation portion 131, becomes the evaluated value.

A large value of each of the sensitivity (the total value of the shape difference) with respect to the exposure parameter and the number of patterns having the same shape, can be determined to be excellent as an instrumentation pattern, and can be considered that the evaluated value is also high. Therefore, in a case where the sensitivity (the total value of the shape difference) with respect to the exposure parameter is A, and the number of patterns having the same shape is B, and when each weight is w1 and w2, it is considered that an evaluated value Y is $Y=w1 \times A+W2 \times B$. In addition, by adding each of o1 and o2 of an offset value, the evaluated value Y becomes $Y=w1 \times (A+o1)+W2 \times (B+o2)$. Here, it is considered that the offset value is, for example, a lowermost value which becomes necessary, and a mark of minus is attached. In addition, similar to $Y=w1 \times A \times w2 \times B$, it is considered that the evaluated value is acquired by a product of A and B.

In addition, in a case of a certain degree of value, the evaluated value is acquired by the calculation of index similar to $Y=w1 \times A^{n1} \times w2 \times B^{n2}$ so that the evaluated value is saturated, and it is also considered that the evaluated value is acquired similar to $Y=\log_{n1}(w1 \times A)+\log_{n2}(w2 \times B)$ and $Y=e^{(w1 \times A)}+e^{(w2 \times B)}$ by using a logarithm. In addition, in a case where the sensitivity (the total value of the shape difference) with respect to the exposure parameter is large, it is also considered that $Y=w1 \times A+w2 \times B/w3 \times A$ so that a large number of patterns having the same shape becomes necessary. In addition, it is also considered that an approximate equation is used as a polynomial expression based on the information which is practically evaluated. In addition, it is also considered that the evaluated value which corresponds to the sensitivity with respect to the exposure parameter and the number of patterns having the same shape is acquired based on the information which is practically evaluated by using the table, and the pattern is chosen. In addition, in a case where each of the sensitivity (the total value of the shape difference) with respect to the exposure parameter and the number of patterns having the same shape is equal to or less than a specific value, it is considered that the evaluated value is excluded from the pattern choosing by forcibly setting the evaluated to be "0". In addition, with respect to all of the patterns, the evaluated value is acquired, and in a case where there is not an appropriate pattern, it is considered that the instrumentation region is changed. In this case, based on the design data from the current instrumentation region, for example, by using a region shifted by 1 µm to the left as a new instrumentation region, as described above, it is considered that the pattern is chosen in the new instrumentation region.

In addition, in FIG. 10, an explanation view illustrating an example of the instrumentation system 1 which chooses the instrumentation circuit pattern for detecting the exposure parameter including the focus based on the design data, is illustrated. FIG. 10 is different from FIG. 1 in that a portion for creating distribution of patterns having the same shape 14 is added, and the pattern is chosen by using the output of the portion for creating distribution of patterns having the same shape 14 by adding the sensitivity (the total value of the shape difference) with respect to the exposure parameter and the number of patterns having the same shape in the pattern choosing portion 13. In the portion for creating distribution of patterns having the same shape 14, the number of patterns having the same shape is acquired in the plurality of regions in which the instrumentation is performed similar to FIG. 7, and distribution of the number of patterns having the same shape is acquired.

For example, as illustrated in FIG. 7, in a case where there are the 9 regions from site A to site I, it is desirable that there is the number of patterns equivalent to the 9 regions. In this manner, when the sensitivity (the total value of the shape difference) with respect to the exposure parameter and the number of patterns having the same shape when the distribution of the patterns is viewed, and the distribution of the number of patterns, are viewed, a pattern which can be commonly used in the plurality of instrumentation regions, is chosen. The distribution of the patterns having the same shape can be created by acquiring the number of patterns having the same shape for each of the plural regions. By using the distribution, even in a case where all of the common patterns are not selected, for example, it is considered that the region to be commonly used is divided into 2, the 2 patterns are chosen, and the patterns appropriate for each instrumentation region is chosen. In particular, it is possible to choose not two patterns but the plurality of patterns, but a pattern having many commonly used regions is chosen to the utmost. In other words, it is considered that the number of patterns to be used in instrumentation is reduced as small as possible.

It is considered that the pattern choosing portion in this case is similar to the above-described pattern choosing portion, and even when acquiring the evaluated value, the value obtained by weighting and adding each of the sensitivity (the total value of the shape difference) with respect to the exposure parameter and the number of patterns having the same shape becomes the evaluated value. In addition, the evaluated value may be a value obtained by performing each index calculation and by making a sum of product. In addition, it is also considered that the pattern is chosen by making a table based on the practically evaluated information. In addition, in a case where each value is equal to or less than a specific value, by forcibly setting the evaluated value to be "0", it is considered that the value is excluded from the pattern choosing.

In addition, when creating the information on the pattern shape by the change of the exposure parameter stored in the pattern shape storage portion, it takes time to form the parameter by the optical simulation or by practical exposure, and to create the information on the pattern shape from the image captured by the SEM. Therefore, it is considered that the pattern is narrowed down to the plurality of patterns in an order from largest number of patterns having the same shape based on the design data, the pattern is formed by the optical simulation and the practical exposure with respect to the narrowed-down pattern shape, and the information on the pattern shape is created from the image captured by the SEM.

In FIG. 11, a view illustrating an example of the instrumentation system 1 which acquires the number of patterns having the same shape in the instrumentation region, selects the pattern having a large number of patterns having the same shape, and chooses the instrumentation circuit pattern after narrowing down. Based on the design data 2, the pattern having a large number of patterns is narrowed down by the portion for calculating the number of patterns having the same shape 12. With respect to the narrowed-down pattern, the information on the pattern shape when the exposure parameter is changed by the optical simulation or a circuit pattern instrumentation portion 30 is stored in the pattern shape information storage portion 3. In addition, the size of the shape difference when the exposure parameter is changed by the exposure parameter sensitivity calculation portion 11 only with respect to the information on the shape of the narrowed-down pattern, is acquired. In addition, similar to FIG. 1, the pattern is chosen based on the size of the shape difference (the change of the shape with respect to the exposure parameter) by the exposure parameter sensitivity calculation portion 11 in the pattern choosing portion 13, and the number of patterns having the same shape by the portion for calculating the number of patterns having the same shape 12.

FIG. 12 is a view illustrating that a portion for creating distribution of patterns having the same shape 7 is added to FIG. 11. Similar to FIG. 10, by using the value of the number of patterns having the same shape from the portion for calculating the number of patterns having the same shape 12, the distribution of the number of patterns having the same shape of the plurality of instrumentation regions is acquired. In FIG. 13, by acquiring the number of patterns having the same shape in the instrumentation region by the portion for calculating the number of patterns having the same shape 12, and the sensitivity (the total value of the shape difference) with respect to the exposure parameter by the exposure parameter sensitivity calculation portion 11, without narrowing down the pattern by each of the number of patterns having the same shape and the sensitivity with respect to the exposure parameter, the pattern is chosen by the pattern choosing portion 13 by using all of the patterns of the instrumentation region as a target.

In addition, in FIG. 14, a view illustrating an example of the instrumentation system 1 which chooses the instrumentation circuit pattern without using the design data, is illustrated. For example, an image is captured by the SEM with a low magnification by changing the exposure parameter, the shape of the circuit pattern of a wide region is acquired, and the shape is stored in the pattern shape information storage portion 3. In the portion for creating distribution of patterns having the same shape 14 from the pattern shape information storage portion 3, the pattern in the SEM image is divided into the plurality of regions. In addition, with respect to the shape of the divided pattern, similar to FIG. 1, a pattern having a high sensitivity (the total value of the shape difference) with respect to the exposure parameter is acquired by the exposure parameter sensitivity calculation portion 11, and additionally similarly, the number of patterns having the same shape in the SEM image is acquired with respect to the pattern divided by the portion for calculating the number of patterns having the same shape 12. Then, similar to FIG. 1, the pattern is chosen by the pattern choosing portion 13. An outline of the portion for creating distribution of patterns having the same shape 14 is illustrated in FIG. 16.

Here, each part of the pattern is divided, and is divided by considering a longitudinal line a, a line end as b, a corner as c, and a horizontal line as d. As a method of dividing each part, the shape of the plurality of parts are stored as the template by using the pattern matching, and the method can be realized by dividing the pattern into each pattern part which matches the template by the pattern matching. It is also considered that the above-described device is also performed by soft processing by using a personal computer. In addition, it is also considered that an LSI is achieved.

REFERENCE SIGNS LIST

1 PATTERN INSTRUMENTATION SYSTEM
2 DESIGN DATA
3 PATTERN SHAPE INFORMATION STORAGE PORTION
11 EXPOSURE PARAMETER SENSITIVITY CALCULATION PORTION
12 PORTION FOR CALCULATING NUMBER OF PATTERNS HAVING SAME SHAPE
13 PATTERN CHOOSING PORTION
14 PORTION FOR CREATING DISTRIBUTION OF PATTERNS HAVING SAME SHAPE
30 OPTICAL SIMULATION OR CIRCUIT PATTERN INSTRUMENTATION PORTION
31 SEM IMAGE
111 POSITIONING PORTION
112 DISTANCE VALUE CALCULATION PORTION
113 EXPOSURE PATTERN SENSITIVITY STORAGE PORTION
121 DRAWING PORTION
122 PATTERN REGION RANGE DETERMINATION PORTION
123 PATTERN MATCHING PORTION
124 COUNTER PORTION
125 PORTION FOR STORING NUMBER OF PATTERNS HAVING SAME SHAPE
131 EVALUATED VALUE CALCULATION PORTION
132 EVALUATED VALUE STORAGE PORTION
133 MAXIMUM VALUE DETECTION PORTION
301 OUTLINE EXTRACTION
302 OPTICAL SIMULATION
303 SELECTOR

The invention claimed is:

1. A pattern measurement condition setting device which sets a pattern measurement condition when measurement of a pattern is executed based on electron detection obtained by emitting a charged particle beam to a sample, the device comprising:
an arithmetic unit which selects a pattern having a predetermined condition from pattern information for each of a plurality of exposure conditions obtained when an exposure condition of a reduced projection exposure device is changed, or pattern information for each of a plurality of exposure conditions obtained when a simulated exposure condition is changed, the arithmetic unit selecting said pattern as an object to be measured or a candidate for the object to be measured, the change of the size or shape of the pattern with respect to a change of the exposure condition satisfying the predetermined condition, and a number of said patterns having a same shape as that of the pattern satisfying the predetermined condition,
wherein the arithmetic unit narrows down the number of the plurality of patterns having the same pattern shape by reducing a size of an instrumentation region and ordering the plurality of patterns based on design data, and calculates the size of change of the pattern shape with respect to the change of an exposure condition parameter by using a result based on the narrowed-down pattern shape or information on the pattern shape formed by changing the exposure condition,
wherein the predetermined condition is based on an exposure condition parameter sensitivity and the number of the plurality of patterns having the same shape, and
wherein the exposure condition parameter sensitivity is determined by calculating a variation of a pattern shape change amount with respect to a change in the size of the instrumentation region and a change in said exposure condition parameter.

2. The pattern measurement condition setting device according to claim 1,
wherein the arithmetic unit selects the object to be measured or a candidate for the object to be measured based on distribution information of the plurality of patterns having the same shape.

3. The pattern measurement condition setting device according to claim 1,
wherein the arithmetic unit calculates a pattern evaluated value by using information based on the size of the change of a pattern shape with respect to the change of the exposure condition, and information on the number of the plurality of patterns having the same shape.

4. The pattern measurement condition setting device according to claim 1,
wherein the arithmetic unit excludes patterns of which the size of the change of the pattern shape with respect to the change of the exposure condition and the number of the plurality of patterns having the same shape are respectively less than a specific value, from the object to be measured or the candidate for the object to be measured.

5. The pattern measurement condition setting device according to claim 1,
wherein the arithmetic unit changes the instrumentation region in a case where there is not an appropriate pattern in the instrumentation region.

6. The pattern measurement condition setting device according to claim 1,
wherein the arithmetic unit detects the plurality of patterns having the same shape while changing the size of an evaluation region in which the plurality of patterns are evaluated.

7. The pattern measurement condition setting device according to claim 2,
wherein the arithmetic unit calculates an evaluated value of a pattern by using information based on the size of the change of the pattern shape with respect to the change of the exposure condition for the instrumentation region, information on the number of the plurality of patterns having the same shape, and information of distribution of the plurality of patterns having the same shape in the instrumentation region.

8. The pattern measurement condition setting device according to claim 7, wherein the arithmetic unit selects the plurality of patterns, and changes a portion of the plurality of patterns by instrumentation region by using the information based on the size of the change of the pattern shape with respect to the change of the exposure condition for each of a plurality of said instrumentation regions, the information on the number of the plurality of patterns having the same shape, and the information of distribution of the plurality of patterns having the same shape in the corresponding instrumentation region.

9. The pattern measurement condition setting device according to claim 2,
wherein the arithmetic unit selects patterns which equivalently exist in a region formed by the plurality of exposure conditions based on the distribution information of the pattern.

10. A pattern measuring device which executes measurement of patterns based on electron detection obtained by emitting a charged particle beam to a sample, the device comprising:
an arithmetic unit which selects a pattern having a predetermined condition from pattern information for each of a plurality of exposure conditions obtained when an exposure condition of a reduced projection exposure device is changed, or pattern information for each of a plurality of exposure conditions obtained when a simulated exposure condition is changed, the arithmetic unit measuring a pattern, a change of a size or shape of the pattern with respect to the change of the exposure condition satisfying the predetermined condition, and a number of a plurality of said patterns having a same shape as that of the pattern satisfying the predetermined condition,
wherein the arithmetic unit narrows down the number of the plurality of patterns having the same pattern shape by reducing a size of a pattern region range and ordering the plurality of patterns based on design data, and calculates the size of change of the pattern shape with respect to the change of an exposure condition parameter by using a result based on the narrowed-down pattern shape or information on the pattern shape formed by changing the exposure condition,
wherein the predetermined condition is based on an exposure condition parameter sensitivity and the number of the plurality of patterns having the same shape, and
wherein the exposure condition parameter sensitivity is determined by calculating a variation of a pattern shape change amount with respect to a change in the size of the pattern region range and a change in said exposure condition parameter.

* * * * *